(12) United States Patent
Kaiser

(10) Patent No.: US 6,265,659 B1
(45) Date of Patent: Jul. 24, 2001

(54) ELECTRICALLY CONDUCTIVE HOUSING FOR AN ELECTRICAL DEVICE

(75) Inventor: Harry Kaiser, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/319,079

(22) PCT Filed: Sep. 30, 1997

(86) PCT No.: PCT/DE97/02243

§ 371 Date: Jun. 1, 1999

§ 102(e) Date: Jun. 1, 1999

(87) PCT Pub. No.: WO98/24280

PCT Pub. Date: Jun. 4, 1998

(30) Foreign Application Priority Data

Nov. 29, 1996 (DE) .............................................. 196 49 516

(51) Int. Cl.⁷ .............................. H02G 3/08; H05K 5/06; H05K 9/00; H01J 5/00
(52) U.S. Cl. .................... 174/52.1; 174/52.3; 174/50.51; 174/35 R
(58) Field of Search ................................ 174/35 R, 52.1, 174/52.3, 50, 50.5, 50.51; 361/818, 800, 816; 220/784

(56) References Cited

U.S. PATENT DOCUMENTS

| 4,431,113 | * | 2/1984 | Sims, Jr. ............................... 220/306 |
| 4,922,380 | * | 5/1990 | Kuki et al. ............................ 361/399 |
| 4,945,448 | * | 7/1990 | Bremenour ............................ 361/383 |
| 5,339,222 | * | 8/1994 | Simmons et al. ..................... 361/818 |
| 5,383,098 | * | 1/1995 | Ma et al. .............................. 361/818 |
| 5,551,589 | * | 9/1996 | Nakamura ............................. 220/326 |

FOREIGN PATENT DOCUMENTS 0 324 573 * 7/1989 (EP) .

* cited by examiner

*Primary Examiner*—Dean A. Reichard
*Assistant Examiner*—Carmelo Oliva
(74) *Attorney, Agent, or Firm*—Ronald E. Greigg; Edwin E. Greigg

(57) ABSTRACT

An electrically conductive housing having a shell-like lid which closes the housing, and the lid and housing mesh with one another on their periphery. The lid comprises a molded sheet-steel part and is provided on its periphery with tongue-like protrusions. The protrusions on their ends self-lockingly engage a wall portion of the housing. As a result, the housing and lid are electrically conductively connected to one another. The shilding action of the housing with the lid for an electrical device disposed in the housing is improved.

4 Claims, 1 Drawing Sheet

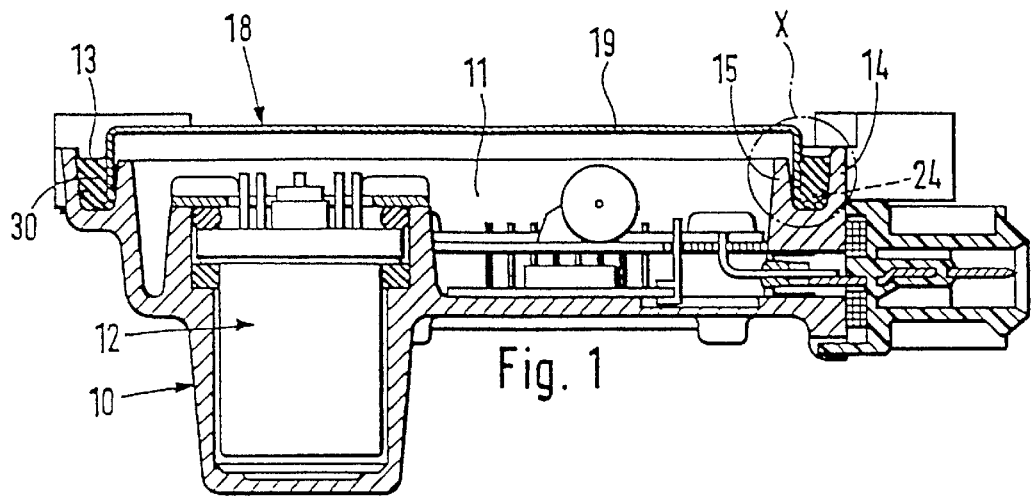
Fig. 1
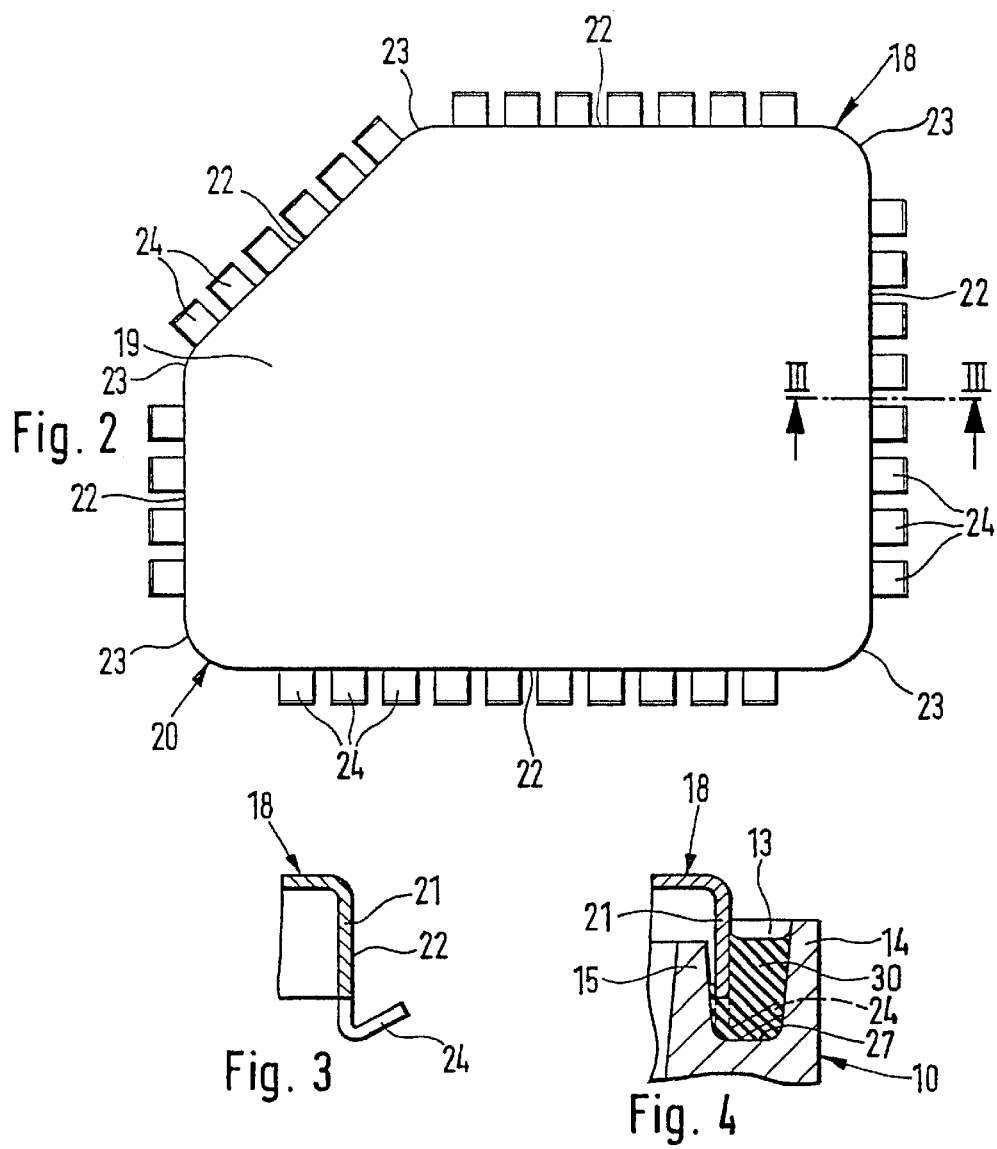
Fig. 2
Fig. 3
Fig. 4

ELECTRICALLY CONDUCTIVE HOUSING FOR AN ELECTRICAL DEVICE

PRIOR ART

The invention is based on an electrically conductive housing for an electric device.

In one such housing found on the market, an electronic sensor to be used in a motor vehicle is disposed in it. Stringent demands are therefore made of the electromagnetic compatibility of this sensor with other electrical or electronic systems in the motor vehicle and with its electromagnetic surroundings. Furthermore, the sensor must be reliably protected by the housing against such environmental factors as moisture and solid articles.

The known housing and its lid comprise die-cast aluminum parts. The housing has an encompassing groove engaged by the lid. Before the joining of the lid, this groove is filled with silicone rubber. At various points of the housing, by means of rivets, the two housing parts are aligned with and connected to one another. A lid opening that allows the exchange of air is likewise closed with silicone rubber during the joining of the lid. This known embodiment does meet the aforementioned demands, but it is very expensive in terms of the lid design and assembly.

From U.S. Pat. No. 4,337,444, a parallelepiped housing of molded metal parts, embodied in accordance with the preamble to claim 1, is known for electromagnetic shielding of an electrical circuit in the housing. On two adjacent peripheries, a lid of the housing has tonguelike protrusions protruding at right angles to the plane of the lid that enclose side walls of the housing. The housing is also provided on the free periphery of two opposed side walls with two sheet-metal tongues each, which reach through slots in the lid. This does not achieve self-locking of the lid to the housing. The lid finds a hold on the housing only by the fact that the sheet-metal tongues are secured on their ends to a circuit board, for instance by soldering.

Conversely, from U.S. Pat. No. 4,431,113, a housing with straight side walls extending at right angles to a flat lid is known, the side walls each being embodied on the outside, near their periphery, toward the lid, with a respective groove extending parallel to the periphery. In the region of each side wall provided with a groove, the lid is provided with a wall extending at right angles to the plane of the lid; on the outside, this wall extends at a slight distance from the side wall. Resilient tongues are cut from the respective wall, and in hooklike fashion engage the associated groove of the side wall and prevent the lid seated on the housing from being lifted away. A substantial disadvantage of the known embodiment, however, is that when the lid is placed on the housing, the tongues have to be forced back into the plane of the wall before they can spread out into the groove, forming an undercut, of the respective side wall. Moreover, the undercuts make the housing more expensive to produce.

Finally, from French Patent Disclosure FR-A 2 665 809, it is known for grooves of housing parts where the housing parts mesh with one another to be filled with a sealing composition.

ADVANTAGES OF PERFECTION

The housing of the invention has an advantage over the prior art that the molded sheet-metal part can be made considerably more economically than a cast part and can be connected to the housing in force- and/or form-locking fashion without the necessity of rivet connections or other kinds of connection. Furthermore, the shielding action of the housing with regard to magnetic fields is improved by using steel for the lid. In addition, by the engagement of the protrusions of the lid with the groove of the housing, joining of the lid to the housing in a way that puts little stress on the protrusions is attained. A housing with a groove that is open toward the lid is relatively simple to make. Finally, positional association of the lid with the housing is attained with only the protrusions of the lid.

The embodiment of the lid disclosed improves its centering relative to the housing, increases the strength of the connection between the lid and the housing, and promotes the shielding action of the housing because the lid is contacted at as many points of the lid circumference as possible.

With the provision set forth herein, the process of installing the lid on the housing is facilitated.

With the shaping of the protrusions on the lid as described herein, the anchoring of the lid is improved because the protrusions "dig into" the wall portion of the housing.

Another provision set forth is advantageous because in addition to sealing off the housing, it serves as an additional protection against the lid coming loose.

BRIEF DESCRIPTION OF THE DRAWING

One exemplary embodiment of the invention is shown in simplified form in the drawing and described in further detail in the ensuing description.

FIG. 1 shows a section through a housing with a lid and containing a sensor;

FIG. 2 shows a plan view on the lid;

FIG. 3 is a section taken along the line III—III in FIG. 2 on a larger scale through the periphery of the lid; and FIG. 4, as a detail, shows the region X of FIG. 1 on a larger scale.

DESCRIPTION OF THE EXEMPLARY EMBODIMENT

A housing 10 in FIG. 1 is embodied as a die-cast aluminum part. In its interior 11, a sensor 12 to be used in a motor vehicle is disposed as an electrical device. The housing 10 has an encompassing groove 13 on its periphery; the groove is formed by two approximately parallel wall portions 14, 15 of the housing and, like the interior 11, is open toward the same side of the housing.

The interior 11 of the housing 10 is closed by a shell-like lid 18 (FIG. 2). The lid is embodied as a molded sheet-steel part with a flat bottom 19, adjoining which is an encompassing wall 21 (FIG. 3), acting as a periphery 20 of the lid and extending at right angles to the plane of the lid. The wall 21 of the lid periphery 20 has straight portions 22, connected to one another by curved portions 23 that have a relatively short radius of curvature.

What is claimed is:

1. An electrically conductive housing (10) for an electrical sensor device (12) in a motor vehicle, comprising a lid (18) that comprises a molded sheet-metal part, the lid closes the housing (10) and has an electrically conductive connection to the housing by means of tonguelike protrusions (24) that protrude from a plane of the lid (18) and are embodied at least intermittently on a periphery (20) of the lid, the tonguelike protrusions on their ends engage a wall portion (14) of the housing (10) in which the wall portion (14) extends substantially at a right angle to the plane of the lid, the lid (18) and the housing (10) meshing with one another on their periphery, the lid (18) comprises the molded sheet-metal part and is provided with the protrusions (24) on opposed portions (22) of its periphery (20), the protrusions are embodied in hooklike fashion and engage a housing groove (13) of U-shaped cross section in the housing (10) which opens toward the lid, the protrusions (24) are supported on a bottom (27) of the groove (13) and on their ends self-lockingly engaging the wall portion (14) of the housing (10) that laterally defines the housing groove (13), and the protrusions (24) are embodied with sharp edges on their ends and because of their sharp edges dig into the wall portion (14) of the housing (10).

2. The housing according to claim 1, in which the protrusions (24) are embodied in hooklike fashion and deflect backward counter to the joining direction of the lid (18).

3. The housing according to claim 1, in which the lid (18) with the periphery (20) and the protrusions (24) meshes with the housing groove (13) which is filled with a sealing composition (30).

4. An electrically conductive housing (10) for an electrical sensor device (12) in a motor vehicle, comprising a lid (18) that comprises a molded sheet-metal part, the molded sheet-metal part closes the housing (10) and has an electrically conductive connection to the housing by means of tongue-like protrusions (24) that protrude from a plane of the lid (18) and are embodied at least intermittently on a periphery (20) of the lid, the tonguelike protrusions on their ends engage a wall portion (14) of the housing (10) in which the wall portion (14) extends substantially at a right angle to the plane of the lid, the lid (18) and the housing (10) meshing with one another on their periphery, the lid (18) comprises the molded sheet-metal part and is provided with the protrusions (24) on opposed portions (22) of its periphery (20), the protrusions are embodied in a hooklike fashion and engage a housing groove (13) of U-shaped cross section in the housing (10) which opens toward the lid, the protrusions (24) are supported on a bottom (27) of the groove (13) and on their ends self-lockingly engaging the wall portion (14) of the housing (10) that laterally defines the housing groove (13), and the housing groove (13) is embodied extending all the way around the housing, and the protrusions (24) of the lid (18) are disposed along the periphery (20) at least on straight portions (22) of the periphery (20).

\* \* \* \* \*